United States Patent
Allegret-Maret et al.

(10) Patent No.: US 10,170,475 B2
(45) Date of Patent: Jan. 1, 2019

(54) SILICON-ON-NOTHING TRANSISTOR SEMICONDUCTOR STRUCTURE WITH CHANNEL EPITAXIAL SILICON REGION

(71) Applicants: INTERNATIONAL BUSINESS MACHINES CORPORATION, Armonk, NY (US); STMICROELECTRONICS, INC., Coppell, TX (US)

(72) Inventors: Stephane Allegret-Maret, Grenoble (FR); Kangguo Cheng, Schenectady, NY (US); Bruce Doris, Slingerlands, NY (US); Prasanna Khare, Schenectady, NY (US); Qing Liu, Irvine, CA (US); Nicolas Loubet, Guilderland, NY (US)

(73) Assignees: INTERNATIONAL BUSINESS MACHINES CORPORATION, Armonk, NY (US); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 15/448,626

(22) Filed: Mar. 3, 2017

(65) Prior Publication Data
US 2017/0179137 A1 Jun. 22, 2017

Related U.S. Application Data

(62) Division of application No. 13/907,411, filed on May 31, 2013, now Pat. No. 9,620,506.

(51) Int. Cl.
*H01L 29/66* (2006.01)
*H01L 27/092* (2006.01)
(Continued)

(52) U.S. Cl.
CPC ........ *H01L 27/092* (2013.01); *H01L 21/0217* (2013.01); *H01L 21/02164* (2013.01);
(Continued)

(58) Field of Classification Search
CPC ........... H01L 27/092; H01L 21/823807; H01L 21/823814; H01L 27/1116;
(Continued)

(56) References Cited

U.S. PATENT DOCUMENTS

| | | |
|---|---|---|
| 2008/0102573 A1 | 5/2008 | Liang et al. |
| 2011/0180872 A1 | 7/2011 | Yin et al. |
| 2013/0175604 A1 | 7/2013 | Polishchuk et al. |

*Primary Examiner* — Hrayr A Sayadian
(74) *Attorney, Agent, or Firm* — Cantor Colburn LLP; Steven Meyers (57) ABSTRACT

An improved transistor with channel epitaxial silicon. In one aspect, a method of fabrication includes: forming a gate stack structure on an epitaxial silicon region disposed on a substrate, a width dimension of the epitaxial silicon region approximating a width dimension of the gate stack structure; and growing a raised epitaxial source and drain from the substrate, the raised epitaxial source and drain in contact with the epitaxial silicon region and the gate stack structure. For a SRAM device, further: removing an epitaxial layer in contact with the silicon substrate and the raised source and drain and to which the epitaxial silicon region is coupled leaving a space above the silicon substrate and under the raised epitaxial source and drain; and filling the space with an insulating layer and isolating the raised epitaxial source and drain and a channel of the transistor from the silicon substrate.

14 Claims, 13 Drawing Sheets

(51) Int. Cl.
    *H01L 27/11*     (2006.01)
    *H01L 21/8238*     (2006.01)
    *H01L 21/84*     (2006.01)
    *H01L 29/786*     (2006.01)
    *H01L 21/02*     (2006.01)
    *H01L 21/265*     (2006.01)
    *H01L 21/3065*     (2006.01)
    *H01L 21/311*     (2006.01)
    *H01L 21/762*     (2006.01)
    *H01L 27/12*     (2006.01)
    *H01L 29/06*     (2006.01)
    *H01L 29/08*     (2006.01)
    *H01L 29/165*     (2006.01)
    *H01L 29/417*     (2006.01)

(52) U.S. Cl.
    CPC .. *H01L 21/02532* (2013.01); *H01L 21/26513* (2013.01); *H01L 21/3065* (2013.01); *H01L 21/31111* (2013.01); *H01L 21/76224* (2013.01); *H01L 21/823807* (2013.01); *H01L 21/823814* (2013.01); *H01L 21/823828* (2013.01); *H01L 21/823878* (2013.01); *H01L 21/84* (2013.01); *H01L 27/1104* (2013.01); *H01L 27/1116* (2013.01); *H01L 27/1203* (2013.01); *H01L 29/0649* (2013.01); *H01L 29/0847* (2013.01); *H01L 29/165* (2013.01); *H01L 29/41783* (2013.01); *H01L 29/6656* (2013.01); *H01L 29/66772* (2013.01); *H01L 29/78654* (2013.01)

(58) Field of Classification Search
    CPC ......... H01L 29/66772; H01L 29/78654; H01L 27/1104; H01L 21/84
    USPC .......................... 257/192, 288; 438/285, 300
    See application file for complete search history.

SILICON-ON-NOTHING TRANSISTOR SEMICONDUCTOR STRUCTURE WITH CHANNEL EPITAXIAL SILICON REGION

DOMESTIC PRIORITY

This application is a divisional of the legally related U.S. application Ser. No. 13/907,411 filed May 31, 2013 which is fully incorporated herein by reference.

BACKGROUND

The present disclosure relates to the fabrication of integrated circuit transistors, and in particular, to the fabrication of silicon channels on silicon-on-nothing (SON) devices.

In the semiconductor industry there is a continuing trend toward manufacturing integrated circuits (ICs) with higher densities. Smaller feature sizes, smaller separations between features and more precise feature shapes are desired in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher cost efficiency in IC fabrication by providing more circuits on a die and/or more die per semiconductor wafer.

In the case of a conventional MOS transistor in "bulk" technology, active zones of the device are directly implanted in a mass ("bulk") of thick silicon forming the silicon substrate. The presence of a thick substrate that is electrically continuous with the active superficial layers, however, induces parasitic phenomena therein, and makes them sensitive to electrical disturbances (for example, leakage currents toward the substrate).

A desirable feature of transistors fabricated using silicon-on-nothing (SON) technology, by comparison with the conventional "bulk" transistors, is the presence of a thin embedded dielectric layer, which insulates the conductive channel of the transistor from the substrate and provides for better control of parasitic effects. SON technology also makes it possible to produce transistors with dynamic properties that are superior to those of the conventional CMOS technology and that are characterized by lower power consumption.

There is a need for circuits that are capable of simultaneously integrating components whose functions involves electrical properties specific to "bulk" devices, and components performing faster functions and thus involving electrical properties specific to SON. Therefore, there is a need to integrate these two types of devices on a single substrate.

BRIEF DESCRIPTION OF THE DRAWINGS

Example embodiments of the present disclosure will be described below with reference to the included drawings such that like reference numerals refer to like elements and in which.

DETAILED DESCRIPTION

For simplicity and clarity of illustration, reference numerals may be repeated among the figures to indicate corresponding or analogous elements. The sizes and relative positions of elements in the drawings are not necessarily drawn to scale. Numerous details are set forth to provide an understanding of the illustrative embodiments described herein. The embodiments may be practiced without these details. In other instances, well-known methods, procedures, and components have not been described in detail to avoid obscuring the disclosed embodiments. The description is not to be considered as limited to the scope of the exemplary embodiments shown and described herein.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment", "certain embodiments", "an embodiment", "an example", "an implementation", "an example" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

Unless the context requires otherwise, throughout the specification and claims that follow, the word "comprise" and variations thereof, such as "comprises" and "comprising" are to be construed in an open, inclusive sense, that is, as "including, but not limited to."

In accordance with certain aspects of the present disclosure, a logic transistor has a silicon substrate; an epitaxial silicon region in contact with an upper surface of the silicon substrate; a gate stack structure in contact with the epitaxial silicon region; and a raised epitaxial source and drain in contact with the silicon substrate and having portions in contact with the epitaxial silicon region and the gate stack structure. A SRAM transistor has a silicon substrate; an isolation layer formed on the silicon substrate; an epitaxial silicon region formed on a first portion of the isolation layer; a raised source and drain in contact with second and third portions of the isolation layer and in contact with the epitaxial silicon region, the first portion of the isolation layer on which the epitaxial silicon regions is formed disposed between the second and third portions of the isolation layer on which the raised source and drain is formed; a gate stack structure in contact with the epitaxial silicon region and in contact with the epitaxial source and drain.

Therefore, in accordance with embodiments described herein, a method to form a transistor on a silicon substrate, the method comprising: forming a gate stack structure on an epitaxial silicon region disposed on a silicon substrate, a width dimension of the epitaxial silicon region approximating a width dimension of the gate stack structure; and growing a raised epitaxial source and drain from the silicon substrate, the raised epitaxial source and drain in contact with the epitaxial silicon region and the gate stack structure. Wherein the transistor is a SRAM device, the method further comprises: removing an epitaxial layer in contact with the silicon substrate and the raised source and drain and to which the epitaxial silicon region is coupled leaving a space above the silicon substrate and under the raised epitaxial source and drain; and filling the space under the raised epitaxial source and drain and above the silicon substrate with an insulating layer and isolating the raised epitaxial source and drain and a channel of the transistor from the silicon substrate.

Figure 1:
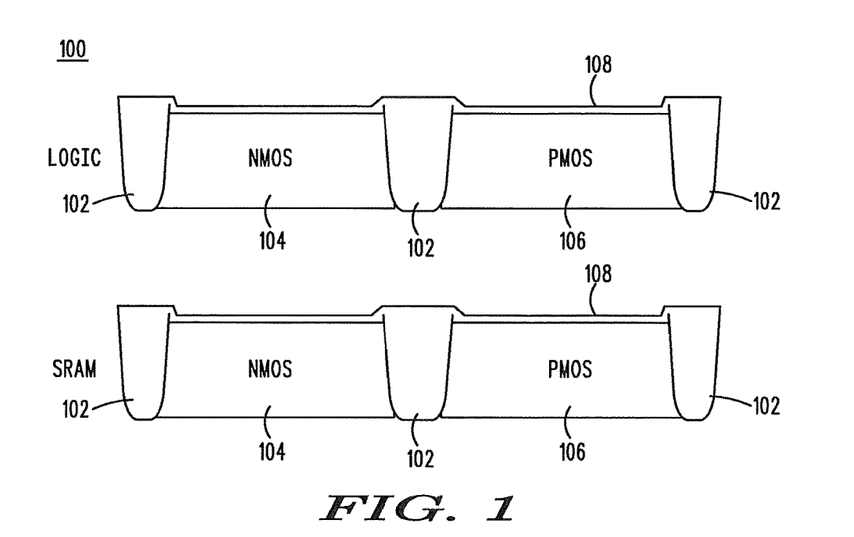
FIG. 1 illustrates formation of a trench structure, in accordance with embodiments of the present disclosure.

The trench structure 100 of FIG. 1 includes an N-doped substrate 106, a P-doped substrate 104, trenches 102 (three are shown), a hard mask oxide layer 108. This trench structure is formed in both logic structures and static random access memory (SRAM) structures of the integrated circuit, as shown.

Doped wells are formed in the silicon substrate to facilitate formation of NMOS and PMOS devices. PMOS devices are typically formed in an N-well that is doped with a material having an excess of electrons (e.g., Group V elements such as phosphorous or arsenic). NMOS devices are typically formed in a P-well that is doped with a material lacking valence electrons (e.g., a Group III element, typically boron).

The oxide hard mask 108 is deposited over the trenches 102 and substrate portions 104, 106 by a standard technique, for example, exposing the silicon to an oxygen-rich environment at high temperature for thermal oxidation of the silicon. The oxide layer 108 is a thin insulating layer used to passivate the silicon surface. Removal of a native oxide layer on the silicon surface can precede the growth of the pad oxide layer 108.

The oxide hard mask 108 may be a silicon dioxide (SiO2) mask or a mask of other isolation material. While the hard mask is described as SiO2, it may be formed of other materials. As is known, a hard mask technique is desirable when etching deep structures that require a longer etch time, because the hard mask can withstand the etch process more reliably than can a photoresist.

Figure 2:
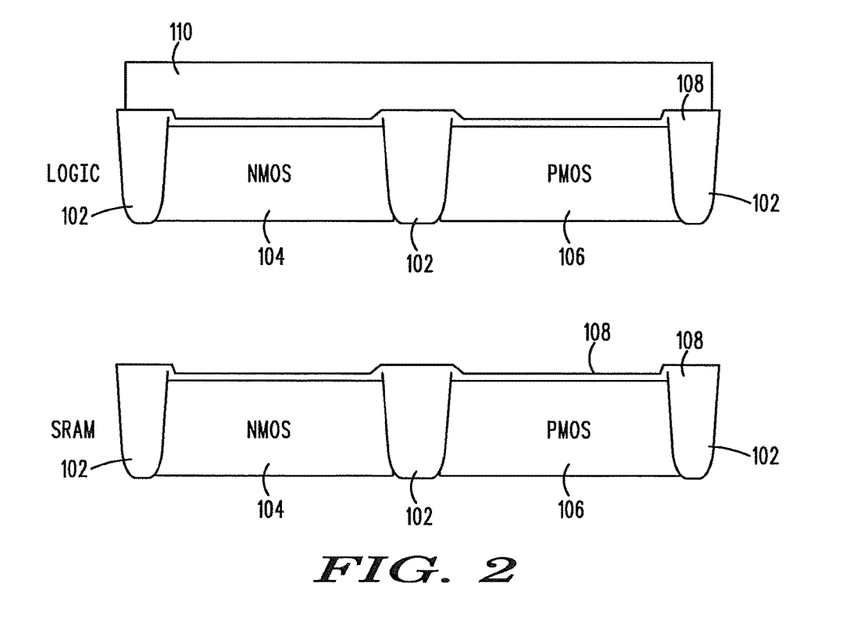
FIG. 2 illustrates a photoresist mask used in lithography to protect logic structures, in accordance with embodiments of the present disclosure.
Figure 3:
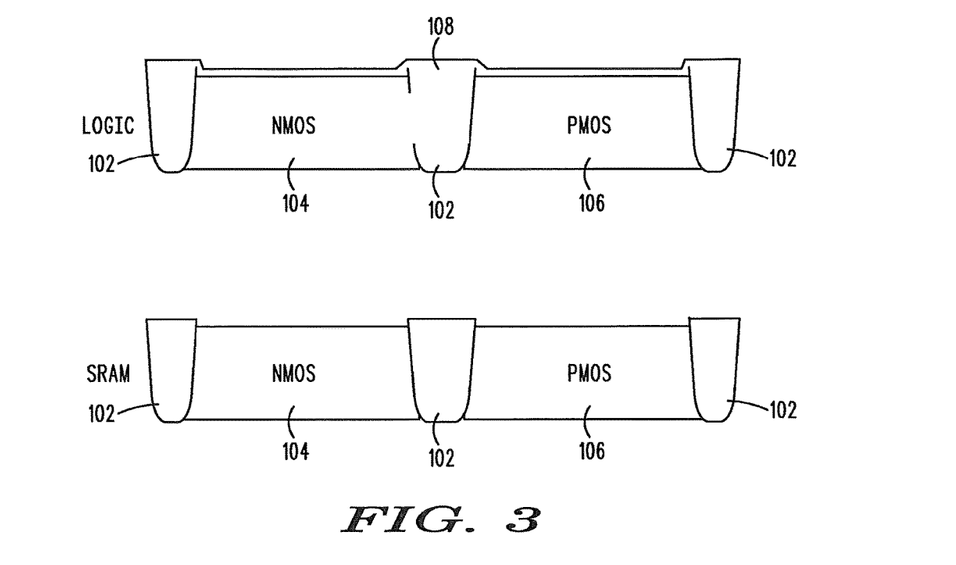
FIG. 3 illustrates hard mask removal on SRAM devices, in accordance with embodiments of the present disclosure.

Referring now to FIG. 2, a photoresist mask 110 is placed over the logic structures to protect the logic during the subsequent hard mask removal, illustrated in FIG. 3. Conventional optical lithography entails spinning on a photoresist, exposing portions of the photoresist to ultraviolet light through a patterned mask, and developing away the unexposed portions of the photoresist, thereby transferring the mask pattern to the photoresist. The photoresist mask can then be used to etch the mask pattern into one or more underlying layers. Typically, a photoresist mask can be used if the subsequent etch is relatively shallow, because photoresist is likely to be consumed during the etch process. In this manner, the oxide layer is removed from the doped substrate portions 104, 106 of the SRAM, expositing the silicon substrate. The SiO2 oxide pad 108 is left intact over the logic structures.

Figure 4:
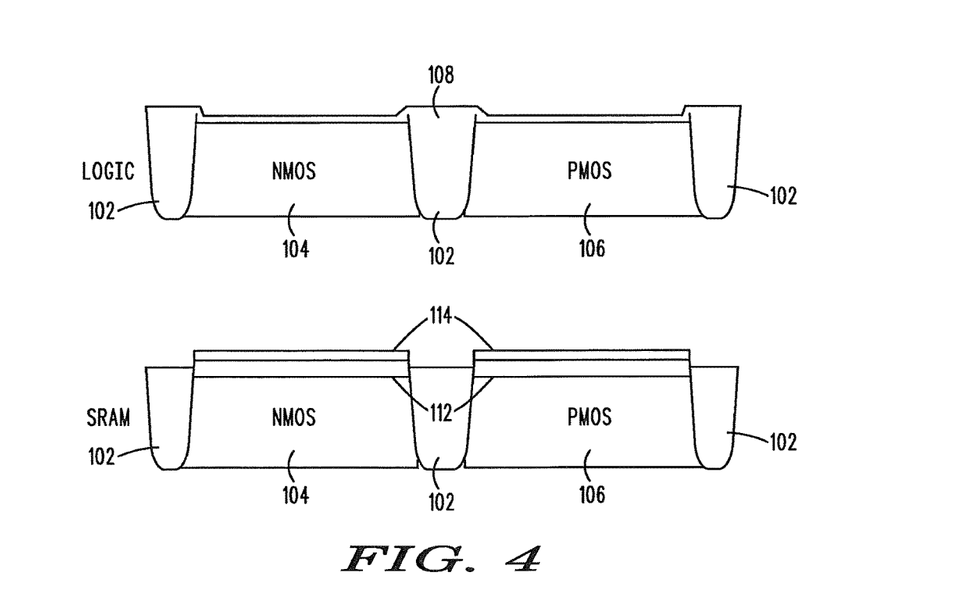
FIG. 4 illustrates selective silicon and silicon germanium on SRAM devices, in accordance with embodiments of the present disclosure.

Next, as shown in FIG. 4, a silicon germanium (SiGe) epitaxial layer 112 is selectively formed on the N-doped substrate 106 and a P-doped substrate 104 portions, followed by a silicon (Si) epitaxial layer selectively formed on the SiGe epitaxial layer. Silicon germanium (SiGe) epitaxy is performed on the doped substrate regions 104, 106 to form a SiGe epitaxial layer 110 from the substrate regions. As used herein, the term epitaxy refers to a controlled process of crystal growth in which a new, epitaxial, layer of a crystal is grown from the surface of a bulk crystal, while maintaining the same crystal structure of the underlying bulk crystal. In this example, the SiGe epitaxial layer 112 is formed to a thickness of between approximately 10 nm to approximately 50 nm and the Si epitaxial layer 114 is grown to a thickness of between approximately 2 nm to approximately 50 nm. The Si epitaxial layer 114, then, may be a thinner layer than the SiGe epitaxial layer 112. The epitaxial silicon compound used for the layer 112, for example, may be silicon germanium (SiGe) in which the germanium content is within the range of about 35% to about 65%.

There is no such epitaxial growth over the logic structures, which are still protected by the SiO2 hard mask.

The Si and SiGe layers described herein are examples of epitaxial silicon compounds, a term that is not to be construed narrowly to limit an epitaxially grown structure to Si, SiGe, or SiC, for example. Rather, the term "epitaxial silicon compounds" is broadly construed to cover any compounds and materials that can be grown epitaxially from a silicon substrate.

Figure 5:
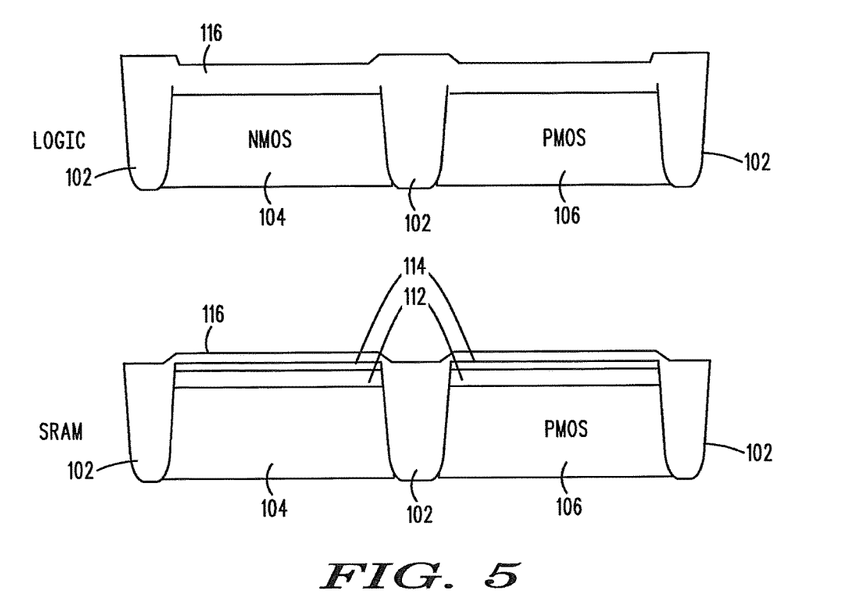
FIG. 5 illustrates oxide deposition, in accordance with embodiments of the present disclosure.

The selective epitaxial formation of FIG. 4 is followed by another oxide layer 116, such as SiO2, deposited over both logic and SRAM structures in FIG. 5. This results in double layers of oxide 108, 116 formed over the NMOS and PMOS logic devices. In the SRAM devices, the new oxide layer 116 overlays the selective epitaxial layers 112, 114, as shown.

Figure 6:
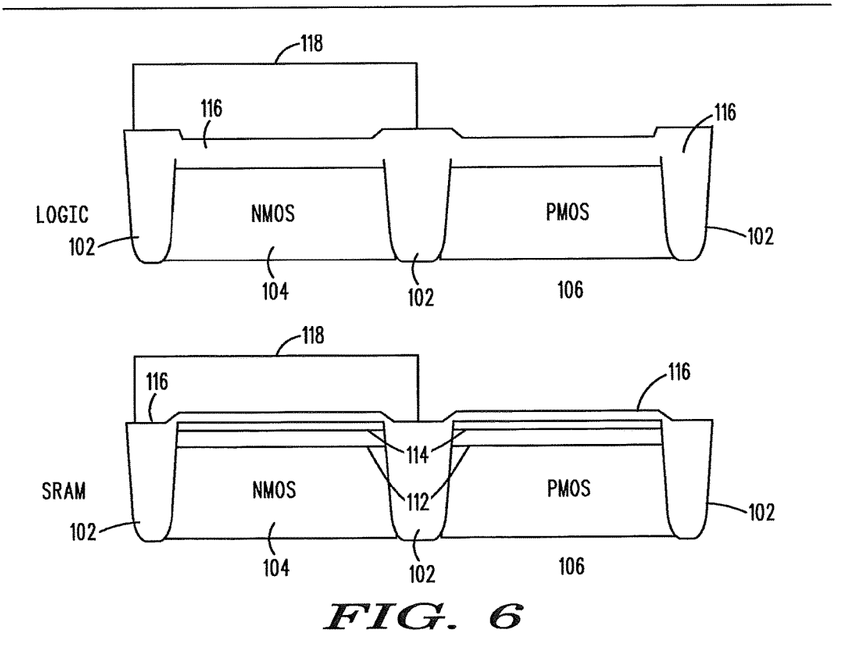
FIG. 6 illustrates a photoresist used in lithography to protect NMOS logic and NMOS SRAM structures, in accordance with embodiments of the present disclosure.
Figure 7:
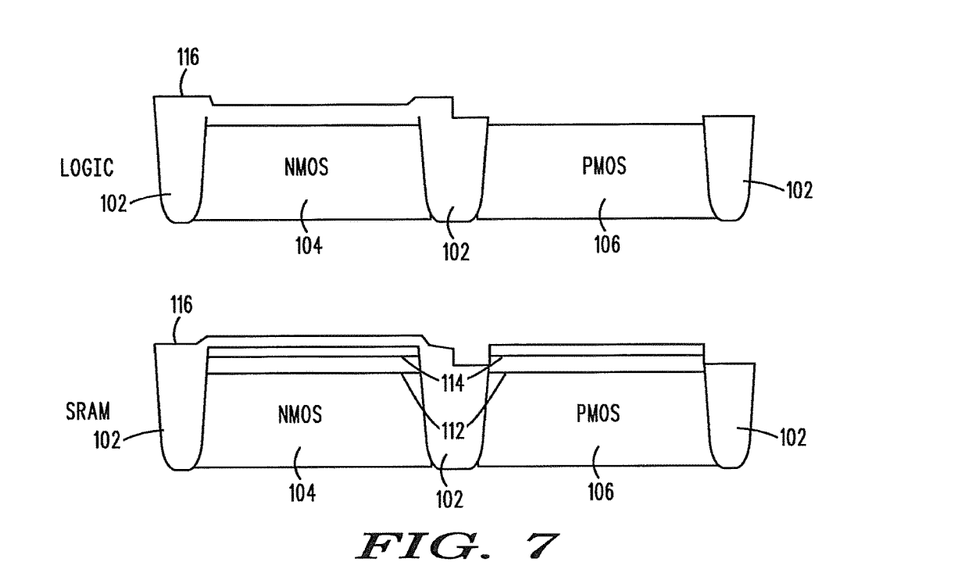
FIG. 7 illustrates hard mask removal on PMOS logic and PMOS SRAM structures, in accordance with embodiments of the present disclosure.

In FIG. 6, standard lithography is employed to deposit photoresist 118 over the NMOS devices to protect the NMOS devices of both the SRAM and logic regions from a subsequent etching process to selectively remove the oxide hard mask as illustrated in FIG. 7. As a conventional optical lithography and etch processes is well-known to those skilled in the art of semiconductor processing, it is not explicitly shown in the figures, but will be described briefly. Conventional optical lithography entails spinning on a photoresist, exposing portions of the photoresist to ultraviolet light through a patterned mask, and developing away the unexposed portions of the photoresist, thereby transferring the mask pattern to the photoresist. The photoresist mask can then be used to etch the mask pattern into one or more underlying layers. Typically, a photoresist mask can be used if the subsequent etch is relatively shallow, because photoresist is likely to be consumed during the etch process.

In this case, a hydrofluoric (HF) etch is used to selectively remove the oxide hard mask over the PMOS devices of the logic and SRAM regions. Other techniques may optionally be employed, such as, Reactive Ion Beam (RIE).

Figure 8:
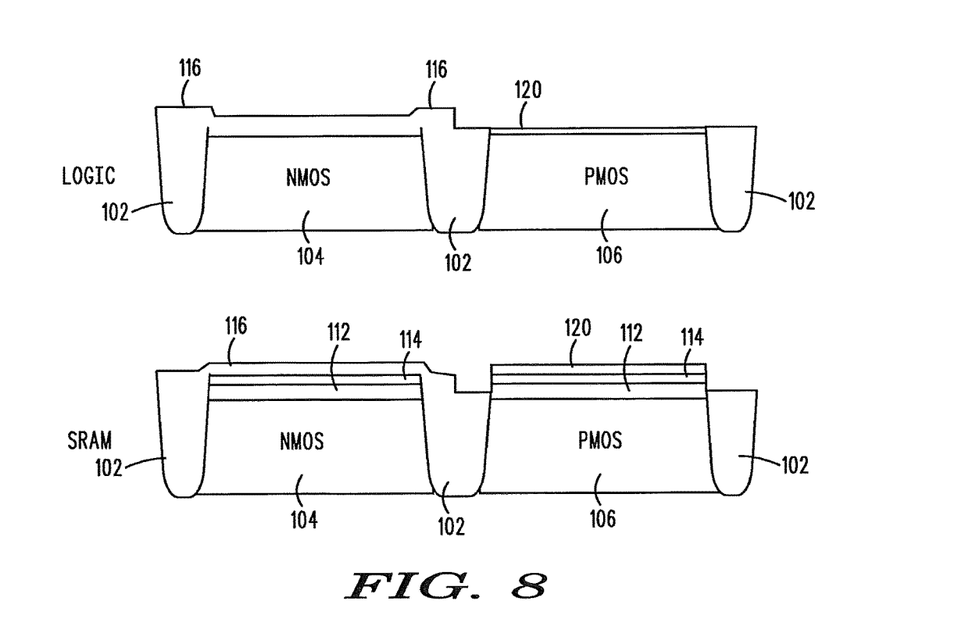
FIG. 8 illustrates selective epitaxial growth of silicon germanium on PMOS logic and PMOS SRAM structures, in accordance with embodiments of the present disclosure.
Figure 9:
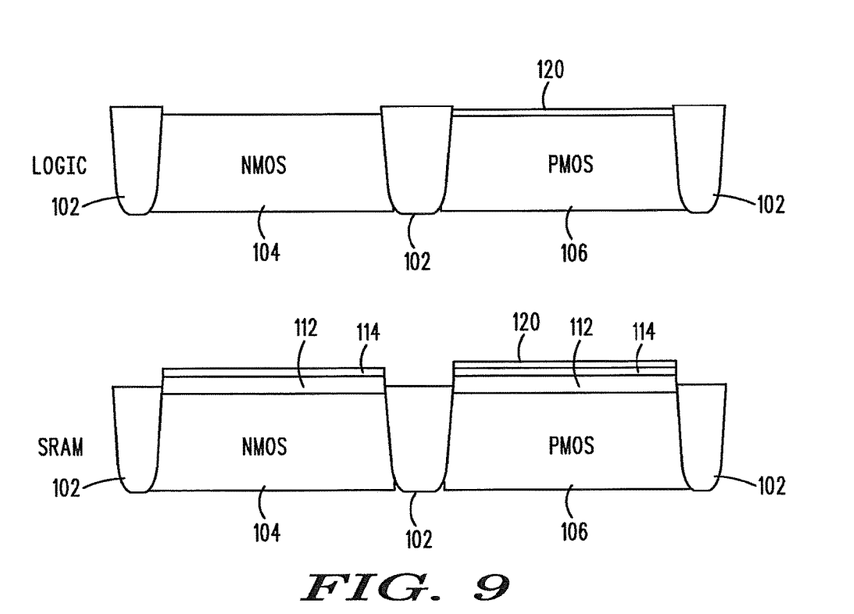
FIG. 9 illustrates hard mask removal, in accordance with embodiments of the present disclosure.

The etching of FIG. 7 is following by selective epitaxial growth (SEG) on the PMOS devices in FIG. 8. SiGe is selectively grown on the PMOS devices for both logic and SRAM as SiGe layer 120, as shown. Growth of SiGe may result in a layer of SiGe 120 of between approximately 2 nm to 50 nm. SiGe is used for hole mobility improvement and to tune the threshold voltage Vth of the transistor. The use of SiGe increases control of the mobility of charge carriers in the semiconducting channel. Introducing compressive strain into the transistor materials tends to increase charge mobility, resulting in a faster switching response to changes in voltage applied to the gate. Strain can be introduced, for example, by replacing bulk silicon in the source and drain regions, or in the channel itself, with epitaxially-grown silicon compounds. In the pFET transistor, the typical Vth shift is about 10 mV per percentage of germanium used. For example, for a 250 mV Vth shift, the percentage of germanium in the SiGe material is about 25 percent. The SiO2 oxide hard mask is removed from the NMOS regions of both logic and SRAM, resulting in the structure shown in FIG. 9 in which the PMOS regions of the logic and SRAM structures are both covered with SiGe epitaxial layer 120. The oxide may be recessed with hydrofluoric acid (HF), SiCoNi, or COR chemistry.

Figure 10:
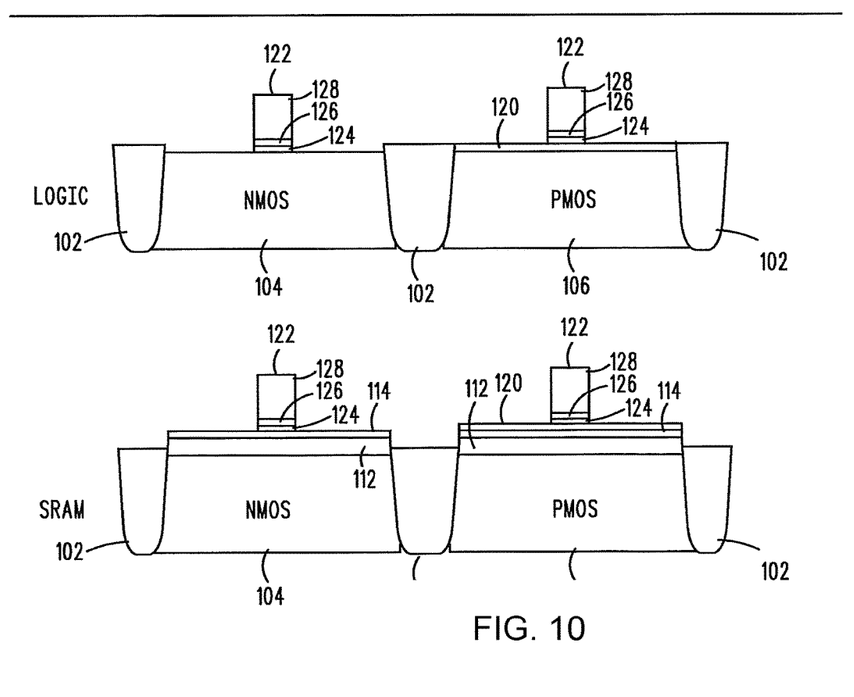
FIGS. 10 to 12 illustrates gate stack formation, in accordance with embodiments of the present disclosure.

Next, starting at FIG. 10, gate stacks 122 are formed on the NMOS and PMOS regions. Layers of hydrofluoric silicon oxide nitride (HfSiON) 124, titanium nitride (TiN) 126, and polysilicon 128 are sequentially deposited on the NMOS and PMOS regions 104, 106. The gate material is patterned and a gate etch stops on the SiGe layer 120 over the PMOS regions 106, on the Si layer 114 of the NMOS 104 SRAM region, and on the substrate of NMOS region 104 of the logic structure.

The gate stacks 122 are formed. Composition of a bulk gate material used to form the gate stacks 122 may include a work function metal alloy, for example, tantalum nitride (TaN), titanium nitride (TiN), or titanium aluminum (TiAl). The bulk gate material may be polysilicon. A conventional metal deposition process can be used to deposit the gate 122, such as CVD, PVD, an electroplating process, or an electroless plating process. Alternatively, a polysilicon gate 122 can be deposited.

Figure 11:
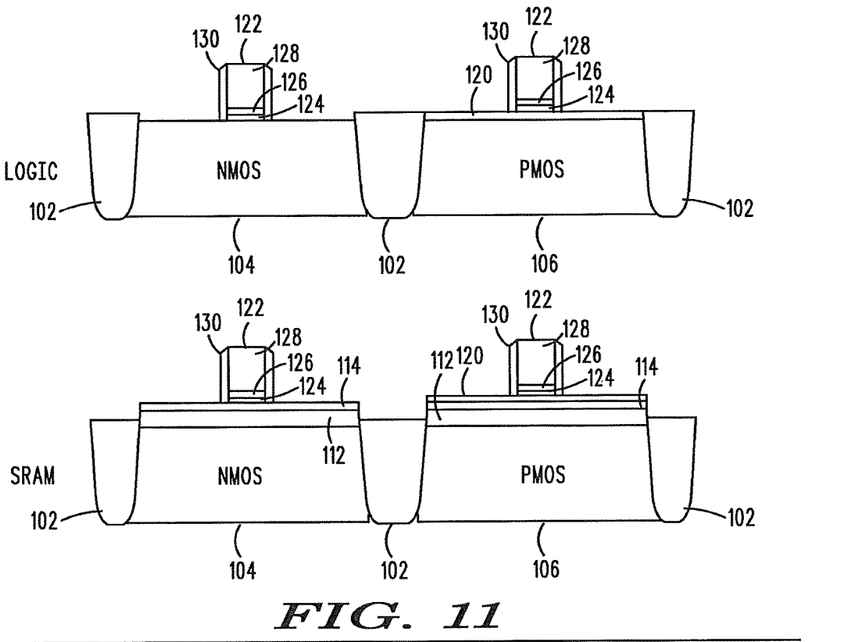

Continuing with creation of the gate regions, spacers of dielectric material are formed by deposition of a silicon nitride (SiN) layer 130 on the sidewalls of the gate stacks 122 in FIG. 11. The silicon nitride layer 130 may be patterned and etched, for example, using a directed (anisotropic) plasma etch, also referred to as a reactive ion etch (RIE) process. Following the RIE etch, a standard wet chemical cleaning process can be used to remove residual photoresist. The thickness of the SiN layer thus formed on the sidewalls may range from approximately 3 nm to approximately 15 nm.

Composition of the gate spacer 130 can alternately be silicon dioxide, having a dielectric constant of about 4.0. The gate spacer can be deposited using, for example, a thermal growth process or a CVD process.

Figure 12:
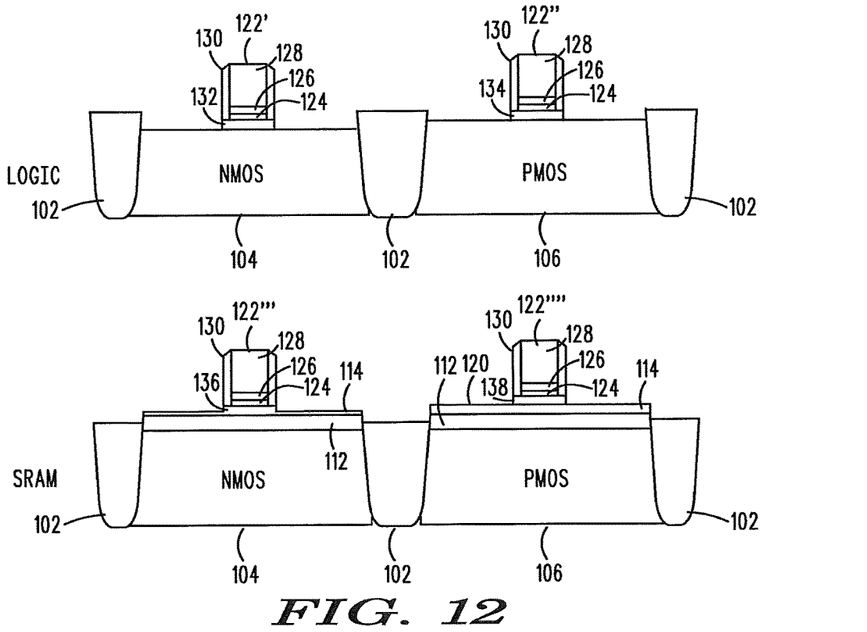

Etching of the exposed silicon epitaxial layer in each of the NMOS and PMOS regions for both logic and SRAM results in the formation of an epitaxial silicon region under the gate stacks in FIG. 12. The use of a RIE process etches into a portion of the exposed silicon epitaxial layer, Si or SiGe as the case may be, resulting in the formation of an epitaxial silicon region under the gates. For the logic NMOS structure, this process results in a Si region 132 under the gate stack 122'. For the logic PMOS structure, this process results in a SiGe region 134 under the gate stack 122". For the SRAM NMOS structure, this process results in a Si region 136 under the gate stack 122'''. For the SRAM PMOS structure, this results in a SiGe region 138 under gate stack 122''''.

As the etching process necessarily cuts into the epitaxial silicon layer to form the epitaxial silicon region under the gate stacks, it can be seen that the layer which is etched is thinner or non-existent than before the etch. For example, for the logic NMOS structure, the NMOS substrate 104 is reduced with respect to the trenches 102. For the logic PMOS structure, the SiGe layer 120 has been removed except for under the gate stack. For the SRAM NMOS structure, the Si layer 114 is thinner though still there, to yield SiGe region 136 under gate stack 122'''. For the SRAM PMOS structure, the SiGe layer has been removed, leaving only SiGe region 138 under gate stack 122''''.

Figure 13:
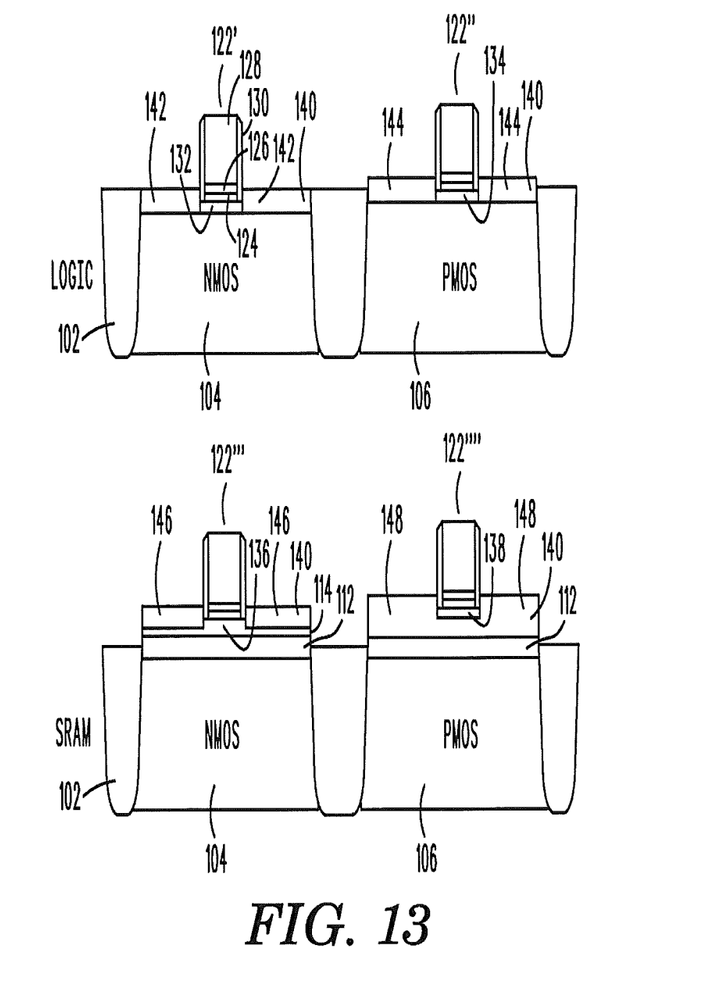
FIG. 13 illustrates raised source and drain formation by silicon epitaxy, in accordance with embodiments of the present disclosure.

In FIG. 13, a raised source/drain is formed by silicon epitaxy. The source/drain epitaxy results in silicon layer 140 formed on either side of the gate stack and the silicon epitaxy region on which the gate stack is formed. Thus, for the logic NMOS device, silicon layer 140 is grown for raised source/drain regions 142. For the logic PMOS device, source/drain regions 144 are formed. For the SRAM NMOS device, source/drain regions 146 are formed. For the SRAM PMOS device, source/drain regions 148 are formed. As will be shown later in connection with the SON and the buried oxide (BOX) processing of FIGS. 17 and 18, the raised source/drain silicon epitaxy will allow the source, drain and channel of the SRAM devices to be fully isolated from the substrate; the source/drain regions are not fully recessed for these devices. The raised source/drain epitaxy may be silicon (Si), silicon germanium (SiGe), silicon germanium boron (SiGe:B), silicon carbide phosphorous (SiC:P), as examples.

Prior to growth of epitaxial source/drain regions from the silicon substrate, a pre-clean can be performed to remove residual oxide, including native oxide, from the silicon surface to prepare the silicon surface for epitaxial growth. The source and drain can be grown epitaxially from the silicon surface, directly after the pre-clean. The presence of a pristine crystalline structure, such as 100 crystalline structure, at the silicon surface tends to facilitate epitaxial growth. There are many possible choices for the composition of the epitaxial raised source and drain, for example, epitaxial silicon, an in-situ-doped epitaxial SiGe layer, or an implanted epitaxial SiC layer, among others.

Figure 14:
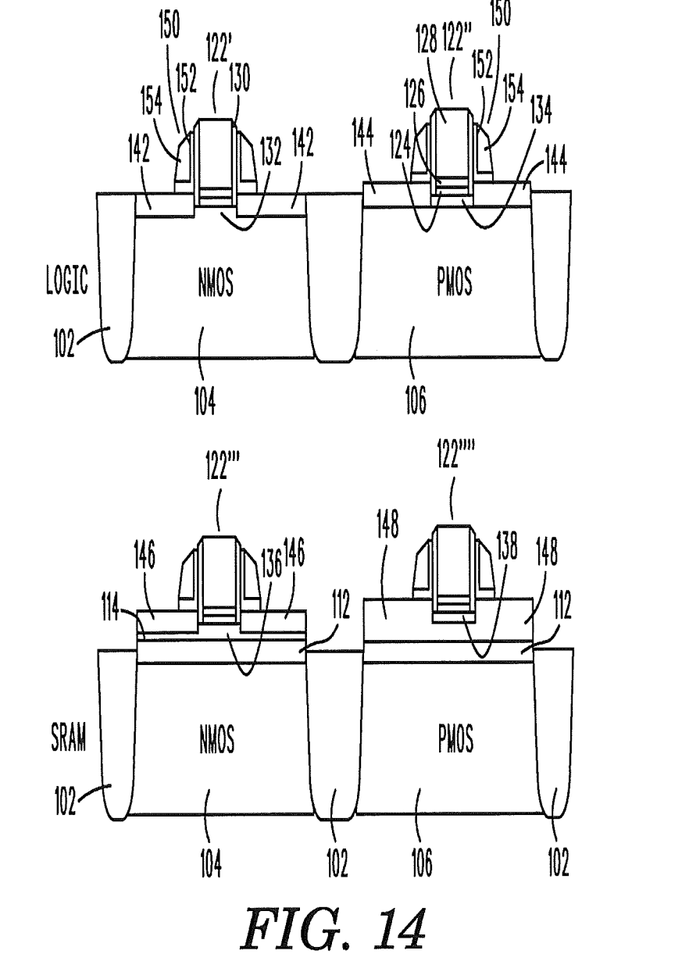
FIG. 14 illustrates spacer formation, in accordance with embodiments of the present disclosure.

In FIG. 14, a final spacer formation is undertaken. A bilayer of SiO2 152 and SiN 154 over SiN spacer 140 followed by selective RIE may be used to form the spacers shown. The spacers are formed on either side of the gate stack. The bilayer spacers may be formed by depositing a first layer of SiO2 on the raised epitaxial source and drain; depositing a layer of SiN over the first layer of SiO2; depositing a second layer of SiO2 on the layer of SiN; and removing by a directional etch the first and second layers of SiO2 and the layer of SiN on either side of the gate stack and above a portion of the raised epitaxial source and drain. The bilayer 150 may be patterned and etched, for example, using a directed (anisotropic) plasma etch, also referred to as a reactive ion etch (RIE) process. Following the RIE etch, a standard wet chemical cleaning process can be used to remove residual photoresist.

Figure 15:
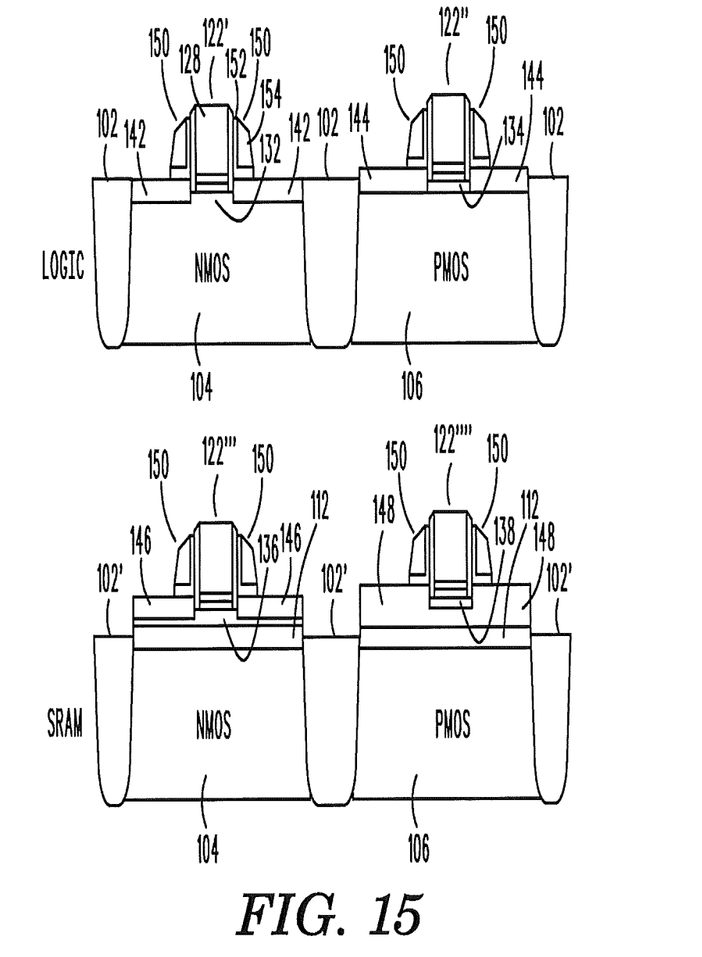
FIG. 15 illustrates recess on SRAM devices to expose sacrificial SiGe layer, in accordance with embodiments of the present disclosure.
Figure 16:
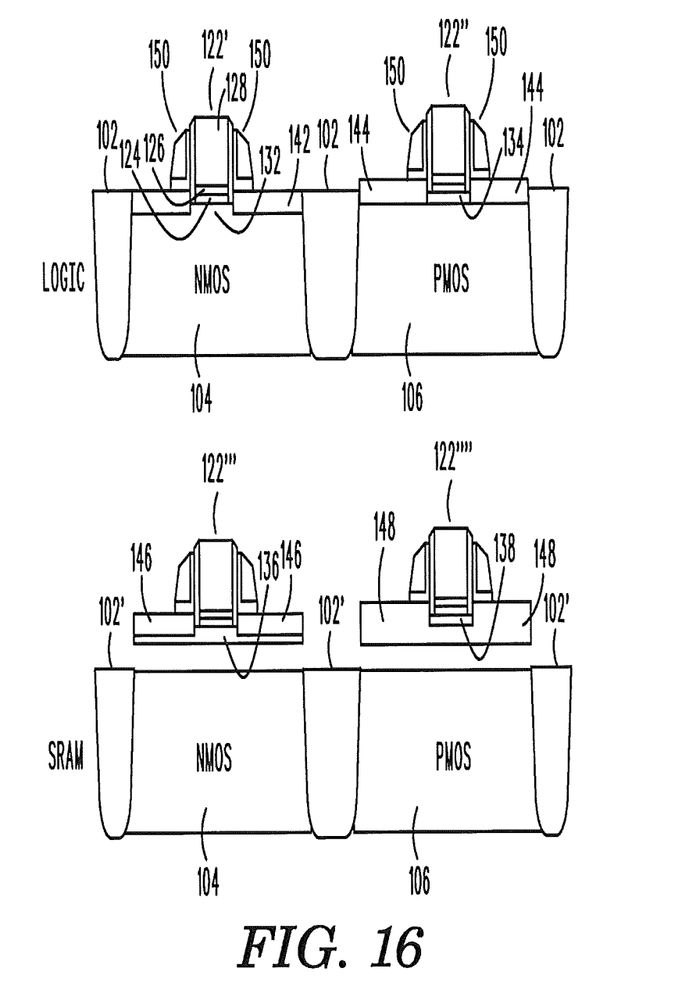
FIG. 16 illustrates removal of exposed sacrificial SiGe layers, in accordance with embodiments of the present disclosure.

Next, in FIG. 15 a shallow trench isolation (STI) recess on the SRAM devices is performed on silicon substrate regions 102 to expose the sacrificial silicon germanium (SiGe) regions 112 of those devices. It can be seen that the STI results in regions 102' recessed to expose SiGe layer 112. Substrate regions 102 may be recessed with hydrofluoric acid (HF), SiCoNi, or COR chemistry. Now that SiGe layer 112 has been exposed, it can be selectively removed in FIG. 16. The SiGe may be selectively removed with a vapor-phase hydrochloric acid (HCl) etch in a range of temperatures, such as between approximately 500 degrees Celsius and approximately 700 degrees Celsius, at a pressure that ranges between approximately 5 Torr and approximately 500 Torr. This is a selective process. The pressure can be approximately 60 Torr to selectively remove SiGe having a germanium content of about 30 percent, or the pressure can be approximately greater than 400 Torr to selectively remove SiGe having a germanium content of about 50 percent. As is known, the Torr unit of pressure, commonly used in vacuum engineering, equals approximately 133.3 pascals. Removal of SiGe layer 112 allows for the source/drain and channel of the SRAM devices to be completely isolated from the substrate.

Figure 17:
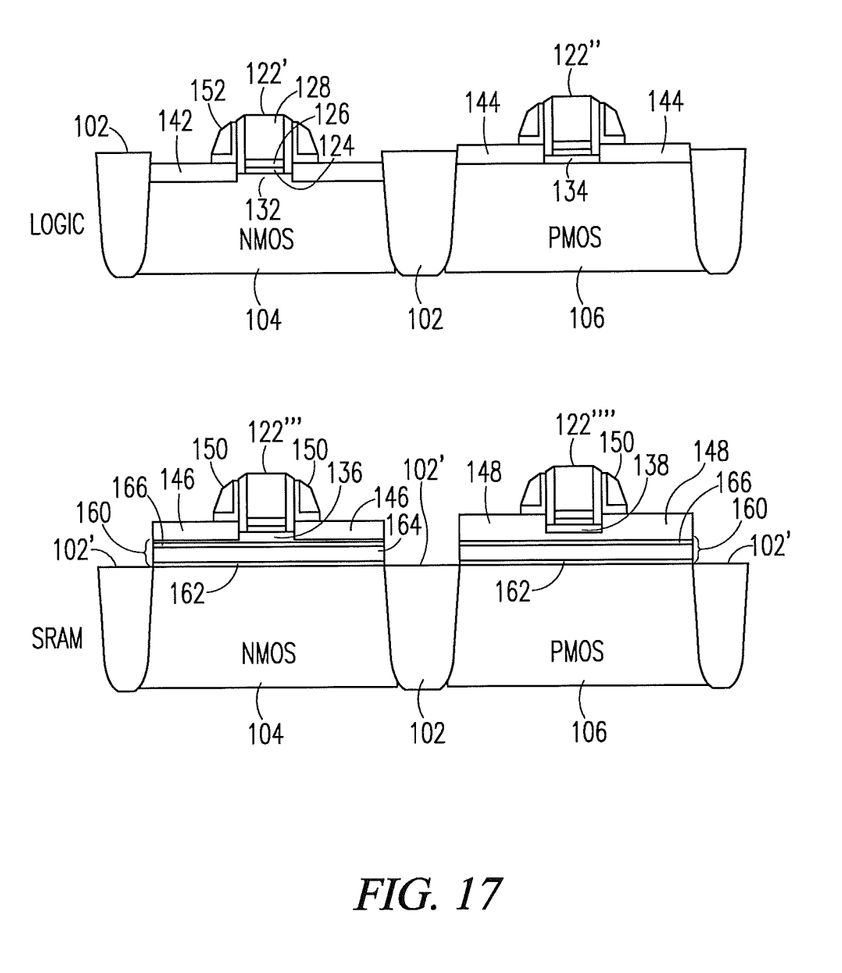
FIG. 17 illustrates formation of an insulating layer below the raised source and drain and the transistor channel, in accordance with embodiments of the present disclosure.

This isolation occurs in FIG. 17. An isolation layer 160 of SiO2 and SiN is deposited on the SRAM structures, followed by a directional etch in a way in which the bilayer remains only underneath the channel, as shown. The buried oxide (BOX) formation fills the empty space below the source/drain regions and the epitaxial silicon region under the channel with insulating material, in this example the SiO2 and SiN isolation layer 160. Filling the space under the source/drain regions and the epitaxial silicon region of the SRAM devices may be accomplished by depositing a first layer of SiO2 162 on the silicon substrate; depositing a layer of SiN 164 over the first layer of SiO2; depositing a second layer of SiO2 166 on the layer of SiN; and removing by a directional etch the bilayer above regions 102', as shown. In this way, the source, drain and channel of the SRAM devices are fully isolated from the substrate.

Figure 18:
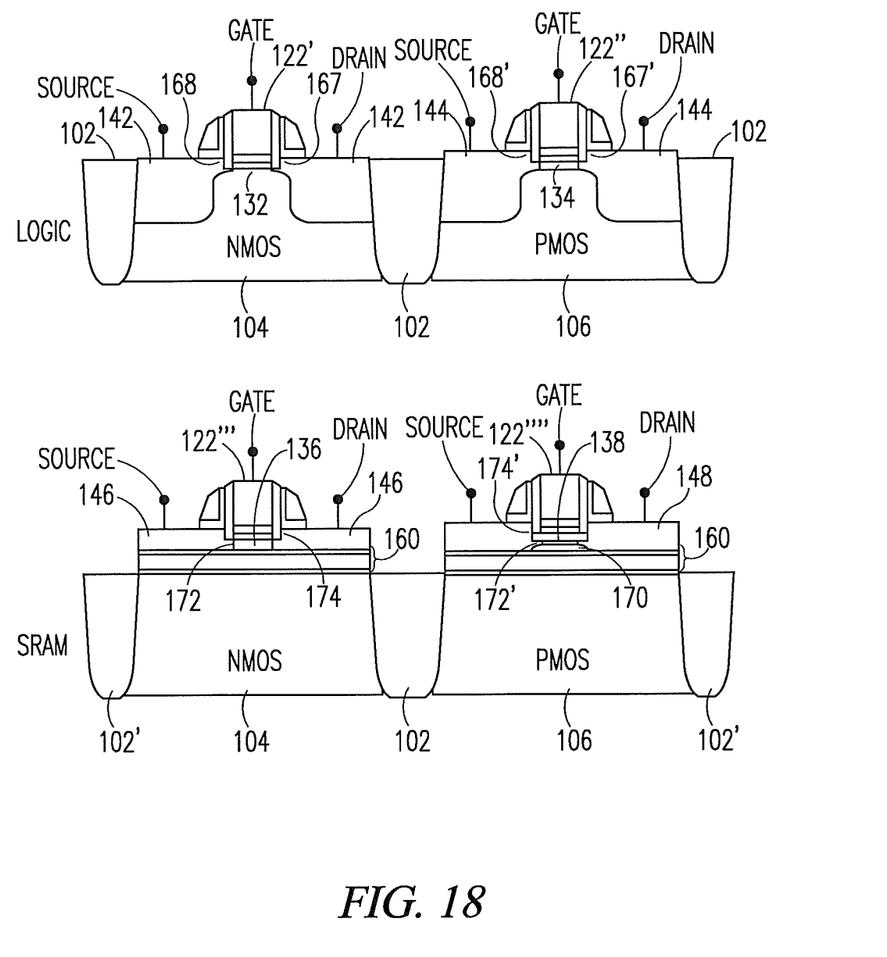
FIG. 18 illustrates final transistor types, in accordance with embodiments of the present disclosure.

In FIG. 18, the final transistor structures are shown. With regard to the source/drain regions, these regions may be epitaxial silicon, an in-situ-doped epitaxial SiGe layer, an implanted epitaxial SiC layer, an implanted silicon germanium boron (SiGe:B), or silicon carbide phosphorous (SiC:P) may be used to form the junction, among others may be employed to form the final transistor structures shown. As explained, the source/drain regions 146, 148, gate stack 122''', 122'''', epitaxial silicon regions 136, 138 and their channels of the SRAM devices are isolated from the substrate by isolation layer 160 as shown.

The final transistor structure varies for each of the transistor types shown, but they all have an epitaxial silicon region interposed between the gate stack and the substrate, either directly or indirectly. It can be seen that where the transistor is a logic device, the transistor has a silicon substrate 104, 106; an epitaxial silicon region 132, 134 in contact with an upper surface of the silicon substrate; a gate stack structure 122', 122'' in contact with the respective epitaxial silicon region 132, 134; and a raised epitaxial source and drain 142, 144 in contact with the silicon substrate and having portions in contact with the epitaxial silicon region and the gate stack structure.

First portions 167, 167' of the raised epitaxial source and drain are in contact with and contiguous with the epitaxial silicon regions 132, 134, respectively, and second portions 168, 168' of the raised epitaxial source and drain are in contact with sidewalls of the gate stack structure 122', 122'', respectively, with the first portions 167, 167' below the gate stack structure, as shown. It can be seen that first portions 167 of the raised epitaxial source and drain in contact with the epitaxial silicon region have a thickness that approximates that of the epitaxial silicon region.

Further, the epitaxial silicon region 132, 134 is in contact with the upper surface of the silicon substrate, the source/drain regions 142, 144, and the gate stack 122' and 122'' in the channel of the device. As is understood from the discussion of formation of the logic devices, the epitaxial silicon region of the NMOS logic device is Si while the epitaxial silicon region of the PMOS logic device is SiGe.

Where the transistor is a SRAM device, the epitaxial silicon region, channel and source/drain are not in contact with the silicon substrate, but isolated from it by isolating layer 160 formed on the substrate of the NMOS and PMOS SRAM devices. The isolation layer 160 covers the silicon substrate, having approximately the same width as shown. The epitaxial silicon region 136, 138 is in contact with the source/drain regions 146, 148, and the gate stack 122''' and 122'''' in the channel of the device. Where the transistor is a PMOS SRAM, a portion 170 of the epitaxial silicon layer that does not make up source/drain regions 148 is interposed between the epitaxial silicon region and the insulating layer 160. As previously described, the epitaxial silicon region 136 of the NMOS SRAM device is silicon (Si) and the epitaxial silicon region 138 of the PMOS SRAM device is silicon germanium (SiGe).

First portions 172, 172' of the raised epitaxial source and drain 146, 148, respectively, of the SRAM devices are in contact with and contiguous with the respectively epitaxial silicon regions 136, 138 and second portions 174, 174' of the raised epitaxial source and drain are in contact with sidewalls of the gate stack structure 122''', 122'''', respectively, with the first portions 172, 172' below the gate stack structure. Further, the first portions 172, 172' of the raised epitaxial source and drain 146, 148 in contact with the epitaxial silicon region have a thickness that approximates that of the epitaxial silicon region to which they are in contact.

The creation of the epitaxial silicon region (Si or SiGe, for example) under the gate stacks in the channel regions, i.e. the channel epitaxial silicon regions, provides the advantages of higher mobility and Vth adjustment of the resulting transistors. PMOS devices need channel SiGe epitaxial regions to provide Vth tuning but the silicon-on-nothing process needs to undercut the channel SiGe in the BOX formation, described in FIG. 17. The challenge of protecting the channel epitaxial silicon regions SiGe in PMOS devices during silicon-on-nothing fabrication is met.

Figure 19:
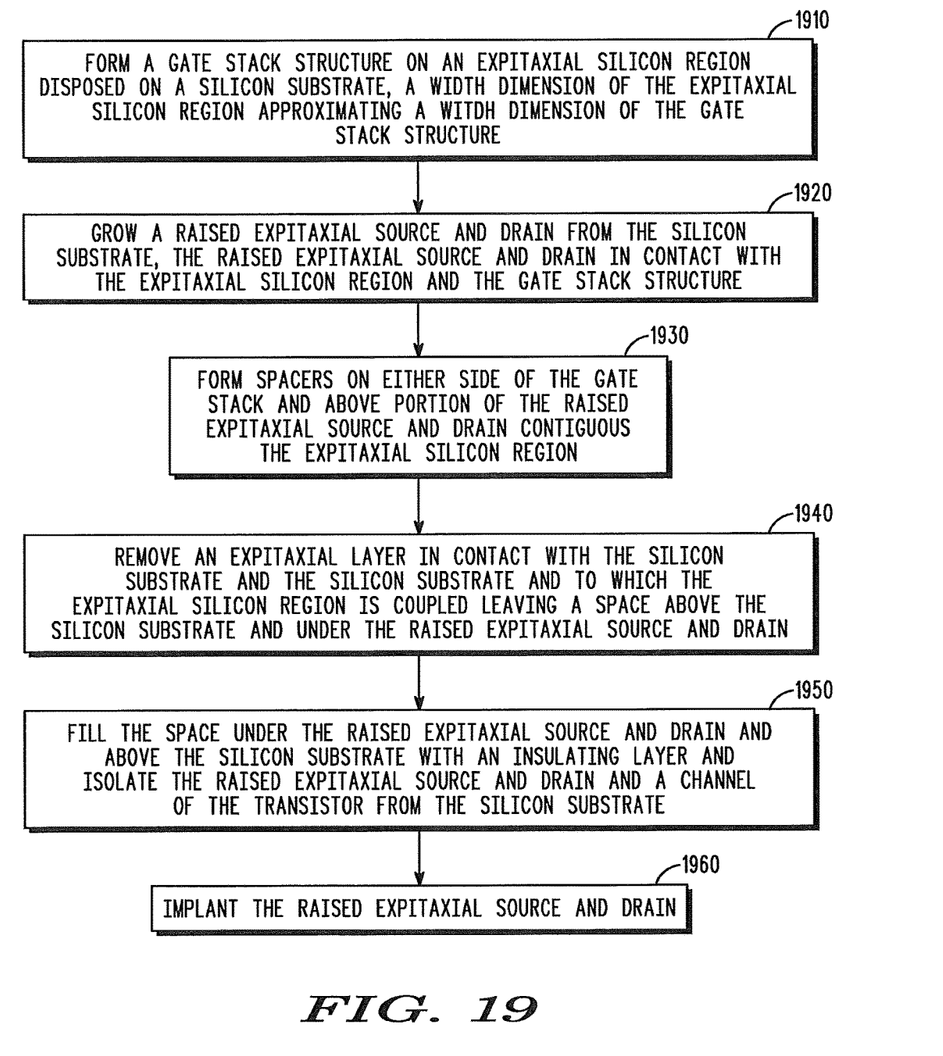
FIG. 19 is a process flow diagram illustrating formation of a transistor device described herein, in accordance with exemplary embodiments of the present disclosure.

Referring now to FIG. 19, a flow chart of a method of forming a transistor on a silicon substrate is shown. At Block 1910, a gate stack structure is formed on an epitaxial silicon region disposed on a silicon substrate, a width dimension of the epitaxial silicon region approximating a width dimension of the gate stack structure as illustrated and discussed in connection with FIGS. 1-12. Next, at Block 1920, a raised epitaxial source and drain is grown from the silicon substrate, the raised source and drain in contact with the epitaxial silicon region and the gate stack structure, as illustrated and discussed in connection with FIG. 13. At Block 1930, spacers are formed on either side of the gate stack and above a portion of the raised epitaxial source and drain contiguous the epitaxial silicon region, as illustrated and discussed in connection with FIG. 14. For SRAM transistors, the actions in Blocks 1940 and 1950 are undertaken. At Block 1940, an epitaxial layer in contact with the silicon substrate and the silicon substrate and to which the epitaxial silicon region is coupled is removed, leaving a space above the silicon substrate and under the raised epitaxial source and drain, as illustrated and discussed in connection with FIGS. 15 and 16. At Block 1950, the space under the raised epitaxial source and drain and above the silicon substrate is filled with an insulating layer and the raised epitaxial source and drain and a channel of the transistor are isolated from the silicon substrate, as illustrated and discussed in connection with FIG. 17. At Block 1960, the raised epitaxial source and drain are implanted, as illustrated and discussed in connection with FIG. 18.

The implementations of the present disclosure described above are intended to be merely exemplary. It will be appreciated by those of skill in the art that alterations, modifications and variations to the illustrative embodiments disclosed herein may be made without departing from the scope of the present disclosure. Moreover, selected features from one or more of the above-described exemplary embodiments may be combined to create alternative embodiments not explicitly shown and described herein.

The present disclosure may be embodied in other specific forms without departing from its spirit or essential characteristics. The described exemplary embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A method of forming a transistor on a silicon substrate, the method comprising:
    forming a gate stack structure on an epitaxial silicon region disposed on a silicon substrate, a width dimension of the epitaxial silicon region approximating a width dimension of the gate stack structure; and
    growing a raised epitaxial source and drain from the silicon substrate, the raised epitaxial source and drain in contact with the epitaxial silicon region and the gate stack structure.

2. The method of claim 1, wherein the transistor is a static random access memory (SRAM) device, the method further comprising:
    removing an epitaxial layer in contact with the silicon substrate and the raised epitaxial source and drain and to which the epitaxial silicon region is coupled leaving a space above the silicon substrate and under the raised epitaxial source and drain; and
    filling the space under the raised epitaxial source and drain and above the silicon substrate with an insulating layer and isolating the raised epitaxial source and drain and a channel of the transistor from the silicon substrate.

3. The method of claim 2, wherein the transistor is a NMOS SRAM device and the epitaxial silicon region is formed on the epitaxial layer.

4. The method of claim 3, wherein the epitaxial layer is silicon germanium (SiGe) and the epitaxial silicon region is silicon (Si).

5. The method of claim 2, wherein the transistor is a PMOS SRAM device and the epitaxial silicon region is not formed directly on the silicon epitaxial layer.

6. The method of claim 5, wherein the epitaxial layer is SiGe and the epitaxial silicon region is SiGe.

7. The method of claim 2, wherein the epitaxial layer is silicon germanium and removing comprises removing the silicon germanium with a vapor-phase hydrochloric acid (HCl) etch at a temperature that ranges between approximately 500 degrees Celsius and approximately 700 degrees Celsius and at a pressure that ranges between approximately 5 Torr and approximately 500 Torr.

8. The method of claim 2, wherein the insulating layer is a bilayer of $SiO_2$ and SiN.

9. The method of claim 8, wherein filling the space further comprises:
    depositing a first layer of $SiO_2$ on the silicon substrate;
    depositing a layer of SiN over the first layer of $SiO_2$;
    depositing a second layer of $SiO_2$ on the layer of SiN; and
    removing by a directional etch the first and second layers of $SiO_2$ and the layer of SiN not formed on the silicon substrate.

10. The method of claim 2, wherein the transistor is a PMOS or NMOS SRAM device.

11. The method of claim 1, further comprising:
    forming spacers on either side of the gate stack and above a portion of the raised epitaxial source and drain contiguous the epitaxial silicon region.

12. The method of claim 11, wherein the spacers are a bilayer of $SiO_2$ and SiN.

13. The method of claim 11, wherein forming the spacers on either side of the gate stack and above a portion of the raised epitaxial source and drain contiguous the epitaxial silicon region further comprises:
    depositing a layer of $SiO_2$ on the raised epitaxial source and drain;
    depositing a layer of SiN over the first layer of $SiO_2$; and
    removing by a directional etch the layers of $SiO_2$ and SiN on either side of the gate stack and above a portion of the raised epitaxial source and drain contiguous the epitaxial silicon region.

14. The method of claim 1, further comprising implanting the raised epitaxial source and drain.

* * * * *